(12) United States Patent
Koen

(10) Patent No.: US 6,229,375 B1
(45) Date of Patent: May 8, 2001

(54) PROGRAMMABLE LOW NOISE CMOS DIFFERENTIALLY VOLTAGE CONTROLLED LOGARITHMIC ATTENUATOR AND METHOD

(75) Inventor: Myron J. Koen, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/377,044

(22) Filed: Aug. 18, 1999

(51) Int. Cl.$^7$ .................................................. H03G 11/08
(52) U.S. Cl. .......................... 327/351; 327/350; 327/308
(58) Field of Search .................................. 327/308, 350, 327/351, 306

(56) References Cited

U.S. PATENT DOCUMENTS

| | | | |
|---|---|---|---|
| 3,537,014 | 10/1970 | Speth | 327/350 |
| 3,539,831 | 11/1970 | Gilbert | 327/75 |
| 3,568,073 | 3/1971 | McGuffin | 327/351 |
| 3,590,366 | 6/1971 | Vaughn | 323/74 |
| 3,700,918 | 10/1972 | Kawashima | 327/350 |
| 3,916,193 | 10/1975 | Corte et al. | 250/336 |
| 4,232,302 | * 11/1980 | Jagatich | 327/350 |
| 4,475,169 | 10/1984 | Gilbert | 364/817 |
| 4,476,538 | 10/1984 | Gilbert | 364/817 |
| 4,500,845 | 2/1985 | Ehni | 330/86 |
| 4,521,764 | 6/1985 | Burton | 340/347 |
| 5,077,541 | 12/1991 | Gilbert | 330/284 |
| 5,134,722 | 7/1992 | Emslie et al. | 455/249.1 |
| 5,159,280 | 10/1992 | Chadwick | 328/145 |
| 5,414,313 | 5/1995 | Crescenzi et al. | 327/351 |
| 5,432,478 | 7/1995 | Gilbert | 330/284 |
| 5,523,712 | 6/1996 | Miyabe et al. | 327/355 |
| 5,877,645 | 3/1999 | Comino et al. | 327/350 |
| 5,880,618 | 3/1999 | Koen | 327/351 |

* cited by examiner

Primary Examiner—Dinh T. Le
(74) Attorney, Agent, or Firm—Cahill, Sutton & Thomas P.L.C.

(57) ABSTRACT

A logarithmically controlled attenuator circuit includes a resistive attenuator having a single series resistive element connected between an input conductor and an output conductor, and a plurality of parallel resistive elements each having a first terminal connected to the output conductor. A plurality of switching elements controllably couple the parallel resistive elements, respectively, between the output conductor and a first reference voltage conductor. A control circuit produces successive gradually increasing and then leveling off analog control signals on the control terminals of successive switching elements, respectively. A programmable implementation includes a first group of parallel resistive elements (Q1,3,5 . . . ) each having a first terminal connected to the output conductor (12), and a second group of parallel resistive elements (Q2,4,6 . . . ) each having a first terminal connected to the output conductor (12).

21 Claims, 7 Drawing Sheets

PROGRAMMABLE LOW NOISE CMOS DIFFERENTIALLY VOLTAGE CONTROLLED LOGARITHMIC ATTENUATOR AND METHOD

BACKGROUND OF THE INVENTION

The invention relates to variable gain logarithmic attenuators and amplifiers, and more particularly to programmable low noise, more accurate CMOS logarithmic attenuators/amplifiers than those disclosed in my commonly assigned U.S. Pat. No. 5,880,618.

The subject matter of this invention is similar to that of the inventor's commonly assigned U.S. Pat. No. 5,880,618, issued Mar. 9, 1999, which is incorporated herein by reference.

Logarithmic attenuator structure 10 in FIG. 1 is essentially the same as shown in FIG. 3 of the '618 patent. Input voltage $V_{IN}$ is applied to conductor 11. A suitable number of transistors, in this example, Q1, Q3, Q5, Q7, and Q9, are connected in series between conductor 11 and conductor 12. $V_{OUT}$ is produced on conductor 12, and is a logarithmically attenuated representation of $V_{IN}$. Each of series transistors Q1, Q3, Q5, Q7, and Q9 are the same size, and each has the same on resistance. Each is biased so as to always be on. The total series resistance between $V_{IN}$ and $V_{OUT}$ is equal to the above on resistance multiplied by the number of series transistors.

Each intermediate node between the various series-connected transistors Q1,Q3 ... Q9 of prior art FIG. 1 is connected to a shunt transistor Q2, Q4, Q6, Q8, and Q10, respectively. The source electrodes of Q2, Q4, Q6, Q8, and Q10 are connected to a fixed common mode reference voltage $V_{CM}$ on conductor 13.

FIG. 2 shows a sequence of control voltages V1,V2 ... V10, the same as in FIG. 4 of the above mentioned '618 patent. By applying the sequential control voltages V1, V2, V3, V4, V5 as shown in the upper graph in FIG. 2, fairly linear attenuation measured in decibels (dB) is achieved if the on resistances of each of the shunt resistors Q2,Q4 ... Q10 are equal.

As the number of stages each receiving a respective sequential control voltage V1, V2, V3 etc. is increased, the number of the cusps 27A in the gain transfer characteristic shown at the bottom of FIG. 2 is increased, and the magnitude of each cusp is reduced. The effect of the noise signals would be significantly less if the series resistance between $V_{IN}$ and $V_{OUT}$ were significantly reduced. A problem with the logarithmic attenuator circuit shown in prior art FIG. 1 is that "noise" signals are generated when the shunt transistors Q2,Q4 ... Q10 are turned off.

Thus, there are unmet needs for a low noise logarithmically controlled attenuator, a low noise, low distortion logarithmically controlled amplifier, a programmable low noise, programmable logarithmically controlled amplifier, and a programmable low noise, low distortion logarithmically controlled attenuator, all of which are unmet by the prior art.

SUMMARY OF THE INVENTION

Accordingly, it is an object of the invention to provide a CMOS logarithmic attenuator/amplifier that has lower noise than the closest prior art.

It is another object of the invention to provide a CMOS logarithmic attenuator/amplifier that has lower noise and lower distortion than the closest prior art.

It is another object of the invention to provide a programmable low noise logarithmic attenuator.

It is another object of the invention to provide a logarithmic attenuator and/or amplifier with programmable peak gain and a programmable gain range.

Briefly described, and in accordance with one embodiment thereof, the invention provides a technique for obtaining low noise, low distortion logarithmic gain/attenuation by providing a resistive attenuator (8A) including an input conductor (11) and an output conductor (12), a single series resistive element (QS) connected in series between the input conductor and the output conductor, and a plurality of parallel resistive elements each having a first terminal connected to the output conductor (12). Each of the parallel resistive elements includes an electrically controllable resistive element having a control terminal operative to control the resistance thereof and a second terminal coupled to a common conductor (13). A plurality of successive piecewise-linear control signals (V1,2 ...) are applied to the control terminals of successive electrically controllable resistive elements, respectively. The plurality of successive piece-wise linear control signals are produced in response to linear changing of a gain control signal ($V_{GC}$) from a first value to a second value.

In one embodiment, one or more additional parallel resistive elements are included in groups with each of the above parallel resistive elements, respectively. The control terminal of each parallel resistive element in each group is connected to a corresponding gain control switch that is responsive to a corresponding gain control signal. The gain/attenuation of the logarithmic attenuator is selectable by switching various combinations of the parallel resistive elements in each group into or out of parallel connection with each other. In another embodiment two or more of the logarithmic attenuators are arranged in a cascade or series connection in order to increase the linearity of the logarithmic attenuator by increasing the number of parallel resistive elements, but without excessively increasing their physical size. In another embodiment the outputs of a differential implementation of the low noise, programmable attenuator are provided as inputs to a programmable low noise differential amplifier in order to provide a programmable low noise, low distortion logarithmic differential amplifier, the outputs of which can be filtered and applied as a logarithmically amplified low noise input to an analog-to-digital converter. In another embodiment the logarithmic attenuator is included in the feedback loop of an operational amplifier.

DETAILED DESCRIPTION OF THE PREFERRED EMBODIMENTS

By way of definition, the terms "logarithmic attenuator" and "logarithmic amplifier" as used herein mean that the gain of the attenuator or amplifier is logarithmic with respect to a gain control input signal applied thereto. Stated differently, the gain expressed in decibels is a linear function of the gain control signal. Also by way of definition, the term "gain" as used herein can refer to a ratio of an output signal to an input signal wherein the magnitude of such gain can be either greater or less than one, and therefore the term can apply to either an attenuator or an amplifier. Further by way of definition, the terms "logarithmic amplifier", "logarithmic attenuator", and the like as used herein are intended to refer to or encompass amplifier circuits or attenuator circuits having gains or attenuation which are logarithmically controlled, for example in response to a gain control signal or an attenuation control signal. The gain or attenuation is set in response to such control signal, and the amplifier circuit or attenuator circuit then amplifies or attenuates an input signal by the set gain or attenuation. Further by way of definition, a MOSFET (metal oxide semiconductor field effect transistor) can function as a voltage controlled switch and/or as a voltage controlled resistor, so it is intended that a particular MOSFET can function as either and/or both. Also, a MOSFET which is biased just at the "edge" of conduction (so its gate-to-source voltage is equal to its threshold voltage) is considered to be "off", and when the magnitude of its gate-to-source voltage is increased above its threshold voltage it is considered to be "on".

Figure 1:
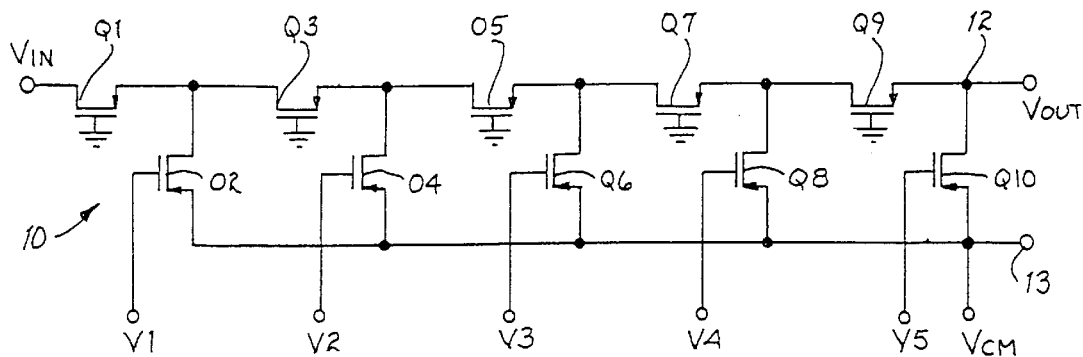
FIG. 1 is a schematic diagram of a portion of a prior art logarithmic attenuator.
Figure 2:
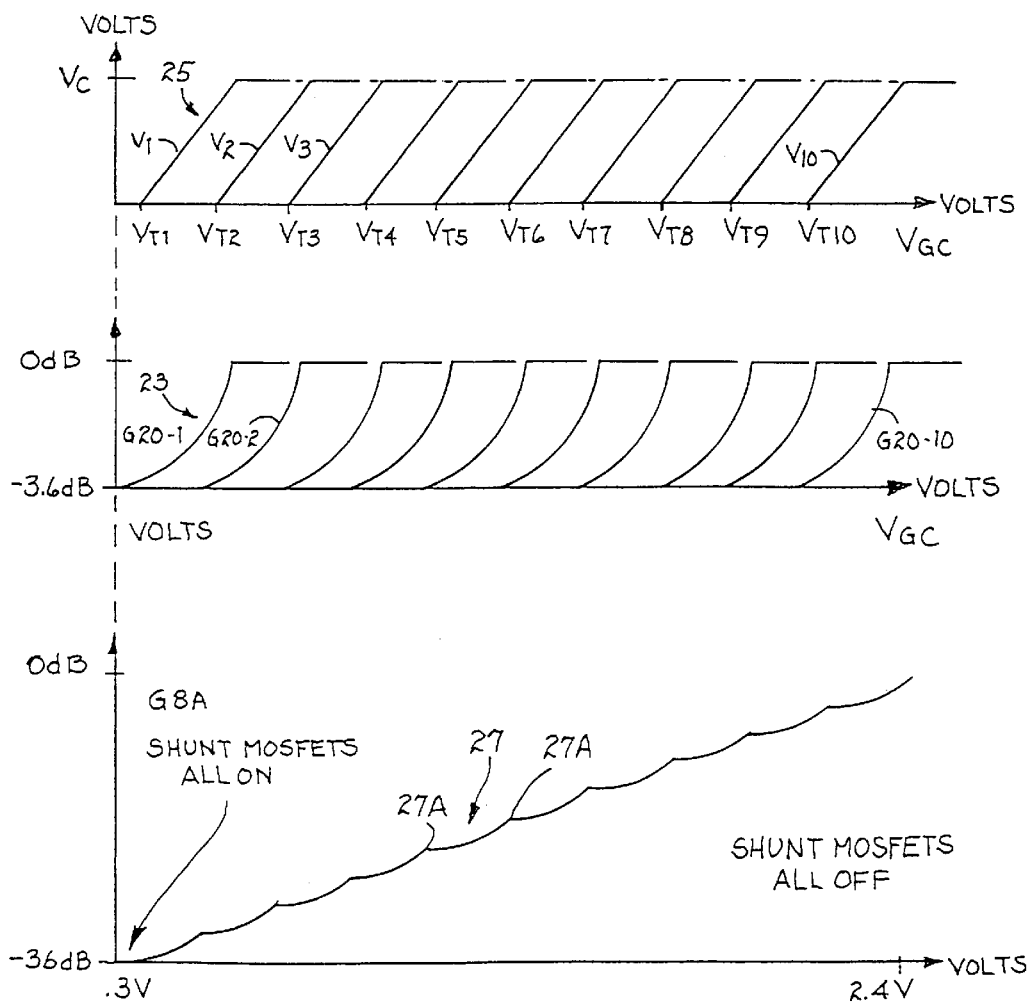
FIG. 2 is a diagram showing transfer characteristics of gain in decibels of the individual attenuator stages and the total attenuator gain as a function of the gain control input voltage useful in describing the logarithmic attenuator of prior art FIG. 1 and also the improved logarithmic attenuator of the present invention.
Figure 3A:
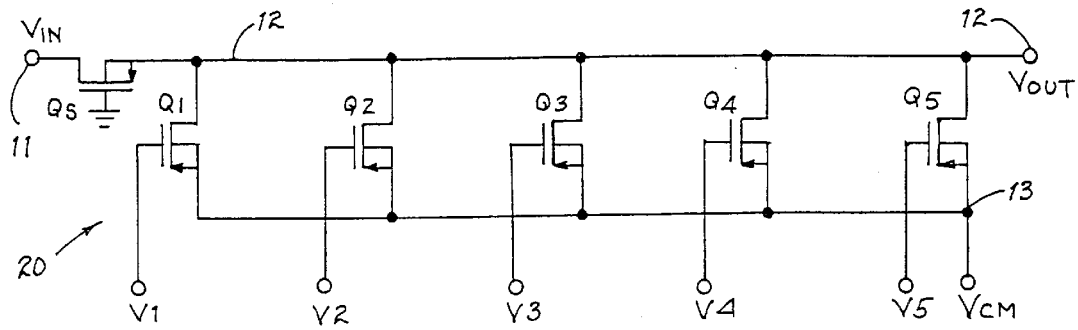
FIG. 3A is a schematic diagram of an improved low noise, linear logarithmic attenuator of the present invention.

Referring now to FIG. 3A, the improved low noise logarithmic attenuator of the present invention is illustrated. It differs from the structure shown in prior art FIG. 1 in that only one series transistor, transistor $Q_S$, is connected between $V_{IN}$ and $V_{OUT}$, so the above mentioned large series resistance between $V_{IN}$ and $V_{OUT}$ in prior art FIG. 1 is greatly reduced for the circuit of FIG. 3A. The challenge was to provide the linear logarithmic attenuation function in a structure which eliminates all of the series transistors except $Q_S$. This was accomplished by the circuit of FIG. 3A, in which the shunt transistors Q1, Q2, Q3, Q4, and Q5 are all connected directly to output conductor 12. Their gates are respectively connected to receive the sequential control voltages V1, V2, V3, V4, and V5, respectively of FIG. 2.

In FIG. 2 the curves designated by numeral 25 show how each of the piecewise-linear individual attenuator section control voltages V1, V2 . . . 10 increases from zero to $+V_C$ volts and then levels off at $V_C$ volts as the gain control voltage $V_{GC}$ is increased to first equal and then to exceed the threshold voltages $V_{T1,2 \ldots 10}$, respectively. Curves 23 in FIG. 2 illustrate the non-logarithmic responses (in decibels) of each of the stages 20-1,2 . . . 10 as the parallel MOSFETs of stages 20-1,2 . . . 10 are successively turned off by increasing $V_{GC}$. The gain (i.e., attenuation) of each of such attenuator sections 20 increases from −3.6 dB to 0 dB as its control voltage V1,2 . . . 10 gradually increases from zero volts to $+V_C$ volts, which can be 1.2 volts. This causes the total gain (attenuation) of attenuator 20 to have the composite logarithmic gain indicated by curve 27 in FIG. 2, increasing from −36 dB with $V_{GC}$ at 0.3 volts to 0 dB when $V_{GC}$ is at +2.4 volts. Overlapping of the individual gain curves G20-1,2 . . . 10 characteristics in response to the individual differential amplifier output signals V1,2 . . . 10 (curves 25 in FIG. 2) results in a generally linear, but slightly "scalloped" appearance with successive "cusps" 27A.

However, the on resistances of the shunt transistors in FIG. 3A are not equal as in prior art FIG. 1. Instead of having channel-width-to-channel-length ratios that are equal as in prior art FIG. 1, the channel widths of the shunt transistors in FIG. 3A are progressively larger, so their on resistances are progressively lower. Specifically, as the shunt transistors are progressively turned on, the attenuation is increased by a fixed number of dB. For example, for 6 dB of attenuation per shunt resistive stage, the W/L ratio of each of the shunt transistors Q2, Q3, etc. is twice that of the previous one. Then, relatively linear, low noise, piecewise logarithmic attenuation is achieved as the voltages V1,V2 . . . V5 of FIG. 2 are progressively applied.

The structure of FIG. 3A not only provides lower noise as explained above, it also provides lower distortion than the prior art circuit of FIG. 1. This is because the distortion produced by the first and only series resistance $Q_S$ of FIG. 3A is not "compounded" by subsequent series resistances such as Q3, Q5, Q7, etc. in the prior art circuit of FIG. 1.

Figure 3B:
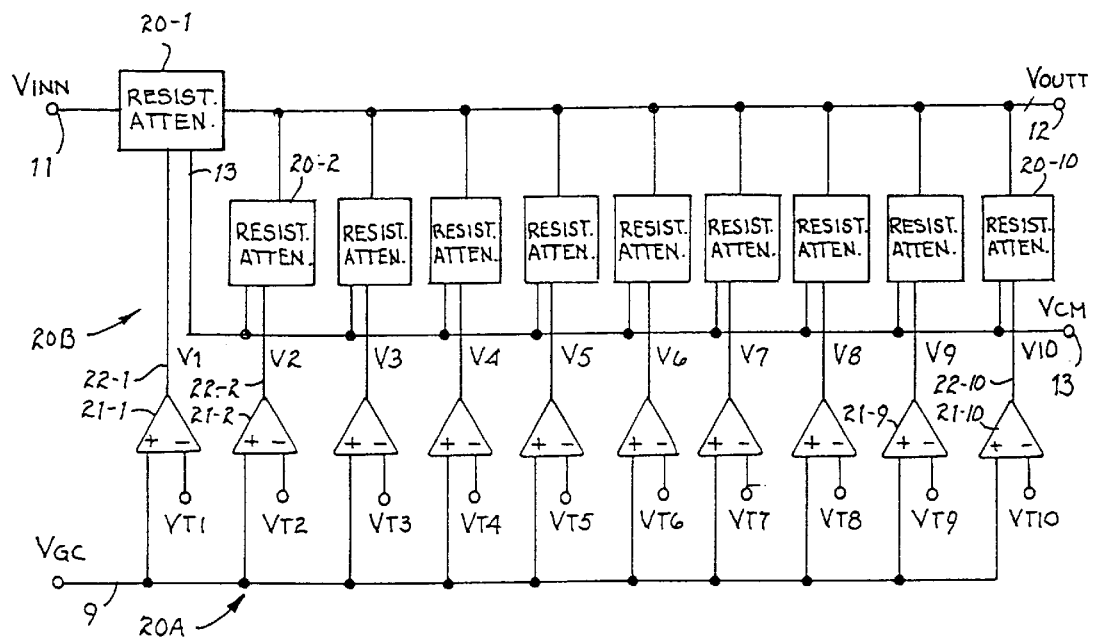
FIG. 3B is a block diagram of the logarithmic attenuator of FIG. 3A.
Figure 3C:
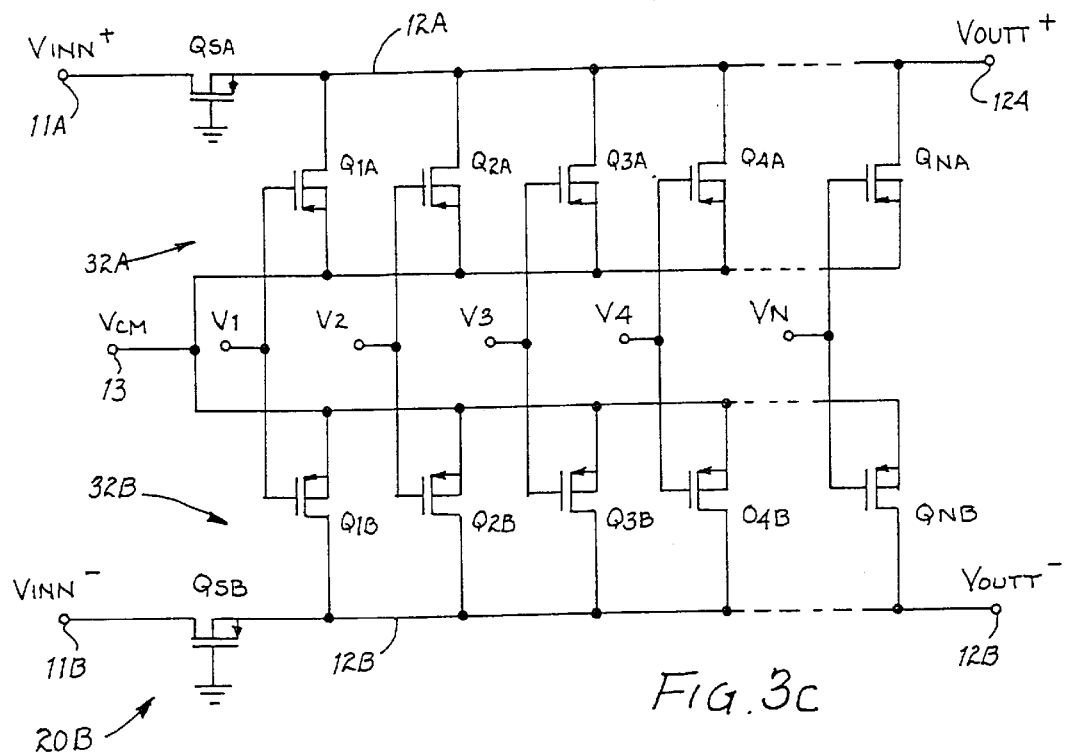
FIG. 3C is a schematic diagram of a differential logarithmic attenuator of the present invention.

Referring to both FIGS. 3B and 3C, differential logarithmic attenuator circuit 20A includes a resistive section 20B including ten sections 20-1,2 . . . 10. The first resistive section 20-1 corresponds to series MOSFETs $Q_{SA}$ and $Q_{SB}$ in FIG. 3C, the drains of which function as inputs and the sources of which are respectively connected to output conductors 12A and 12B, collectively designated by numeral 12 in FIG. 3B. The second through the tenth resistive sections 20-2 to 20-10 in FIG. 3B correspond, respectively, to shunt MOSFETs $Q_{1A,2A} \ldots$ and $Q_{1B,2B} \ldots$ in FIG. 3C. Resistive sections 20-2 to 20-10 of FIG. 3B are connected between output conductors 12 and common mode voltage conductor 13, and are successively switched into electrical shunt connection between conductors 12 and common mode voltage conductor 13 in response to the piecewise-linear signals V1,2 . . .

A differential input signal $V_{INN}=V_{INN}^+-V_{INN}^-$ is applied between two differential input conductors 11A and 11B of the first section 20-1 collectively designated by numeral 11 and shown in detail in FIG. 3C. Note that in FIG. 3B the two conductors between which $V_{INN}$ is applied are collectively designated by numeral 11. Note that in FIG. 3C $V_{INN}^+$ and $V_{INN}^-$ are shown as being applied on input conductors 11A and 11B, respectively, of differential logarithmic attenuator 20B. Also note that in FIG. 3B $V_{OUTT}$ is shown as being produced between conductors which are collectively designated by numeral 12. A differential output voltage $V_{OUTT} = V_{OUTT}^+ - V_{OUTT}^-$ is produced at the output of the last section 20-10.

The differential configuration of the resistive portion 20B of logarithmic attenuator 20A of FIG. 3B was chosen to improve signal linearity. The improved linearity results because the differential configuration tends to cancel second harmonic distortion. The differential configuration also provides good common mode noise rejection.

Referring to FIG. 3C, differential attenuator 20B includes an upper portion 32A essentially identical to FIG. 3A and an essentially identical lower portion 32B. Upper portion 32A includes one "series" P-channel MOSFET $Q_{SA}$ connected between conductors 11A and 12A and N "parallel" P-channel MOSFETs $Q_{1A}, Q_{2A} \ldots Q_{NA}$ connected as parallel components between conductor 12A and conductor 13. The drain of series MOSFET $Q_{SA}$ receives $V_{INN}^+$ on conductor 11A. An attenuated output signal $V_{OUTT}^+$ is produced on conductor 12A.

Similarly, the lower portion 32B of resistive differential attenuator section 20B includes a single series P-channel MOSFET $Q_{SB}$ connected between $V_{INN}^-$ on conductor 11B and $V_{OUTT}^-$ on 12B. Lower section 32B also includes N parallel P-channel MOSFETs $Q_{1B}, Q_{2B} \ldots Q_{2N}$ connected between conductor 12B and conductor 13. The geometries of the above MOSFETs are selected so that an accurate ladder network is formed when they all are fully turned on.

All of the P-channel MOSFETs shown in FIG. 3C have their N-type "body" electrodes connected to their respective source electrodes, to prevent source-to-body reverse bias voltage in the P-channel MOSFETs and thereby also prevent non-linear "body effect" on the threshold voltages of such P-channel MOSFETs. (if N-channel MOSFETs were used in a typical CMOS integrated circuit, it would be impractical to connect their sources to their body electrodes.)

Still referring to FIG. 3C, the source electrodes of all of the parallel MOSFETs $Q_{1A}, Q_{2A} \ldots Q_{NA}$ and $Q_{1B}, Q_{2B} \ldots Q_{NB}$ are connected by a single conductor 13 to receive the common mode voltage $V_{CM}$ produced by a circuit identical to the one shown in FIG. 3 of the '618 patent.

Referring also to FIG. 2, the "piecewise-linear" control voltages V1,2 ... 10 applied to the gate electrodes of the "parallel" MOSFETs $Q_{1A}, Q_{2A} \ldots Q_{NA}$ and $Q_{1B}, Q_{2B} \ldots Q_{NB}$ of FIG. 3C are generated at the outputs of differential amplifiers 21-1,2 ... 10, respectively, which are included in the control portion of logarithmic attenuator 20B. The inverting inputs of differential amplifiers 21-1,2 ... 10 are connected to successively increasing threshold voltages $V_{T1,2 \ldots 10}$, respectively. These threshold voltages are generated by a suitable resistive divider circuit, such as the one shown in FIG. 2A of the '618 patent.

Each of differential amplifiers 21-1,2 ... 10 includes an output stage bias control circuit that maintains the output of that differential amplifier at a voltage approximately equal to a threshold voltage of the corresponding MOSFET Q1,2 ... etc. (which functions as a parallel resistive element and also as a switching element) if the magnitude of the gain control voltage $V_{GC}$ is less than or equal to the magnitude of the threshold voltage applied to the second input of that differential amplifier. This improves the linearity of the logarithmic attenuator. The output stage bias control circuit referred to is shown by reference numeral 58 in FIG. 5 of my above mentioned incorporated-by-reference U.S. Pat. No. 5,880,618.

Figure 4A:
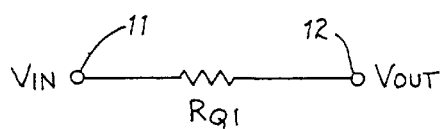
FIGS. 4A–4C illustrate a sequence of equivalent circuits useful in describing the operation and structure of the logarithmic attenuator of FIG. 3.
Figure 4B:
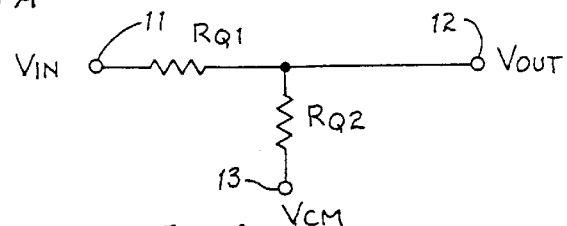
Figure 4C:
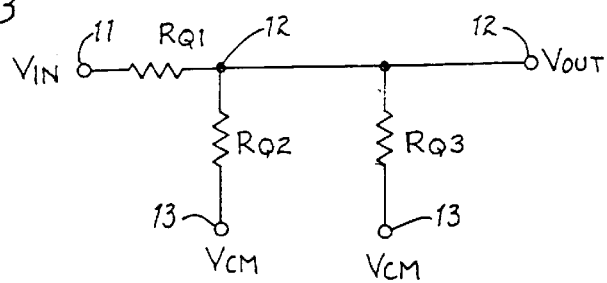

FIG. 4A shows the equivalent circuit of the logarithmic attenuator of FIG. 3A before the first control voltage V1 is applied. The on resistance $R_{Q1}$ of transistor Q1 provides the only attenuation between conductors 11 and 12. FIG. 4B shows the equivalent circuit after Q1 has been turned on by V1. The addition of the shunt resistance $R_{Q2}$ of transistor Q2 in FIG. 4B provides an additional 6 dB of attenuation (or other suitable fixed amount of attenuation) between conductors 11 and 12. To achieve linearity of the logarithmic attenuation, it is necessary that an equal additional amount of attenuation be provided when shunt transistor Q3 is turned on by V3. This is shown in the equivalent circuit of FIG. 4C, in which the on resistance $R_{Q3}$ of Q3 is added in parallel with $R_{Q2}$, wherein in order to obtain the equal additional 6 dB of attenuation, the channel resistance $R_{Q3}$ must be substantially lower than $R_{Q2}$. Similarly, the on resistance of transistor Q4 must be lower than that of shunt transistor Q3, etc.

Figure 5:
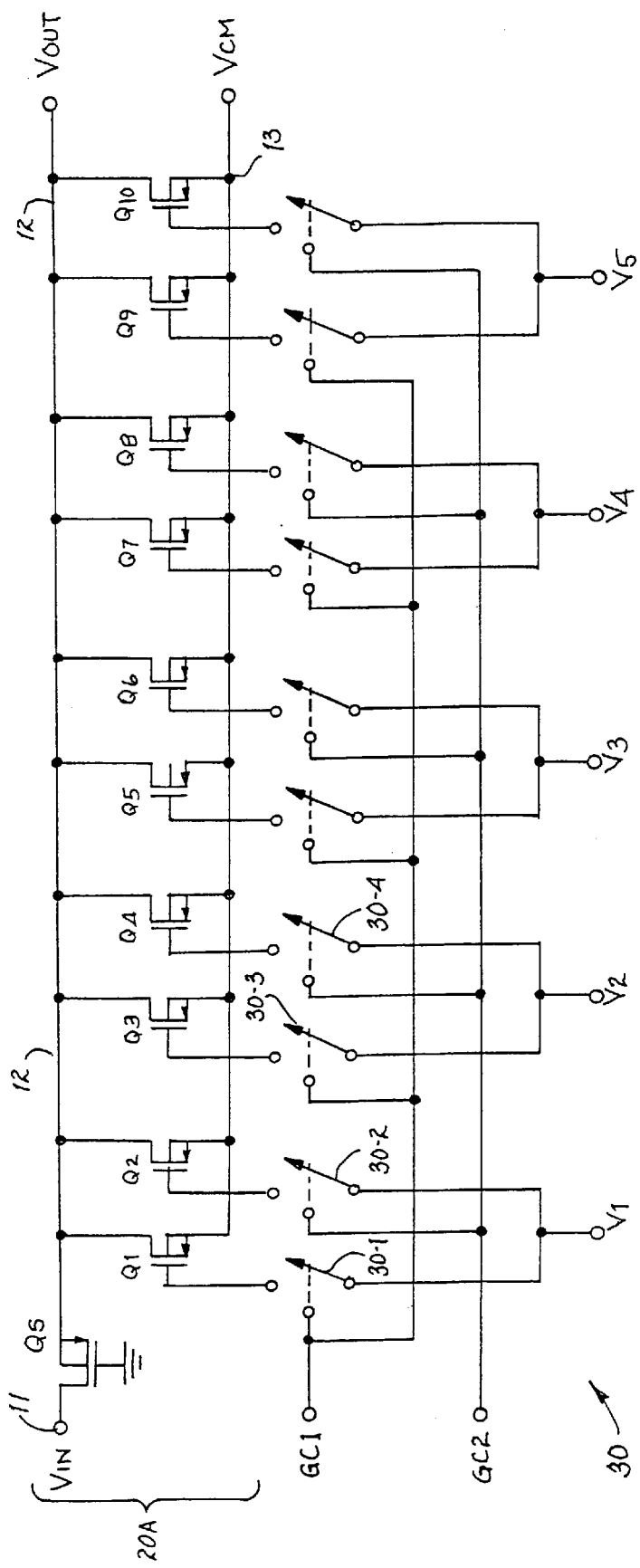
FIG. 5 is a schematic diagram of a programmable logarithmic attenuator based on the circuit shown in FIG. 3.

Referring to FIG. 5, the attenuation of a logarithmic attenuator 30 is digitally programmable in response to two or more digital gain control signals GC1 and GC2. This is accomplished by a modification of the logarithmic attenuator of FIG. 3A wherein at least one additional shunt transistor is connected in parallel with each of the shunt transistors Q1, Q2, ... to form groups of shunt transistors. In each group, the gate of each shunt transistor is coupled to the corresponding control voltage V1, V2, ... by a different switch controlled by a different gain control signal. Specifically, programmable switches 30-1,2 ... 4 control the number of parallel-connected transistors that actually receive the control voltage V1, V2, etc., and therefore control the effective sizes (i.e., channel-length-to-channel-width ratio) of the "composite" or equivalent transistors which receive the control signals V1, V2, etc., respectively. This provides a programmable logarithmic attenuator.

Figure 6:
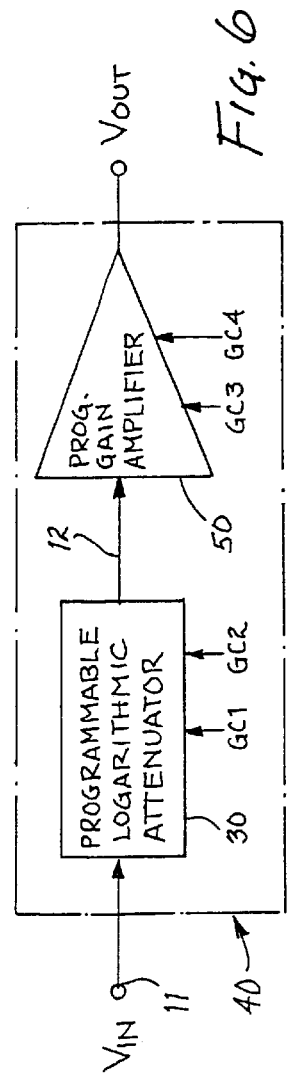
FIG. 6 is a block diagram of a logarithmic attenuator/amplifier having programmable peak gain and programmable gain range.

Next, referring to FIG. 6, the most practical way of obtaining a logarithmic amplifier is to provide a logarithmic attenuator at the input of a linear amplifier. FIG. 6 shows such a programmable logarithmic amplifier 40, including the programmable logarithmic attenuator 30 of FIG. 5 coupled between $V_{IN}$ and the input of a programmable gain linear amplifier 40 which produces $V_{OUT}$. The output of a logarithmic amplifier typically is filtered by a filter and then input to an analog-to-digital converter.

Figure 12:
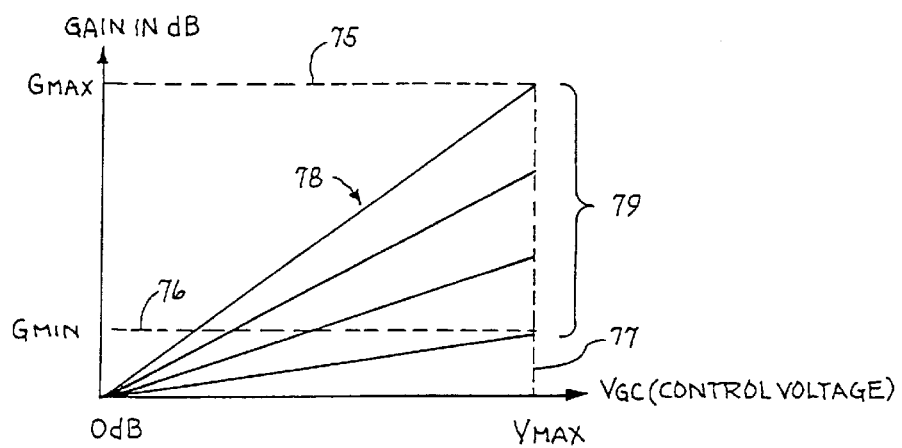
FIG. 12 is a graph useful in describing the operation of the programmable logarithmic amplifier of FIG. 11.

The amount of gain needed in a logarithmic amplifier is a function of the bandwidth of the filter and the number of bits of resolution of the analog-to-digital converter. Therefore, a good range of programmability of the logarithmic amplifier is very desirable if it is to be usable in a wide range of applications which at one extreme have wide band width with high resolution and low gain is likely to be required, and which at the opposite extreme have narrow band width with low resolution and high gain is likely to be needed. In the logarithmic amplifier 40 of FIG. 6 the programming of the attenuation of logarithmic attenuator 30 by digital attenuation control inputs GC1 and GC2 establishes the gain range of logarithmic amplifier 40, and the programming of the gain of linear amplifier 50 by digital gain control inputs GC3 and GC4 establishes the peak gain of logarithmic amplifier 40. Referring to the gain characteristic of FIG. 12, the digital gain control signals GC1-4 establish both the maximum gain $G_{MAX}$ and minimum gain $G_{MIN}$ of logarithmic amplifier 40 of FIG. 6. The programmable gain range 79 is the number of decibels between the lines 75 and 76 indicating $G_{MAX}$ and $G_{MIN}$. Each characteristic curve 78 (for convenience, only four are shown) in the gain versus $V_{GC}$ characteristic is for a different setting of the gain control inputs. The programmable logarithmic amplifier 40 of FIG. 6 allows use of a single product to meet the needs of the above mentioned wide band, high resolution systems and the low band width, low resolution systems.

Figure 7:
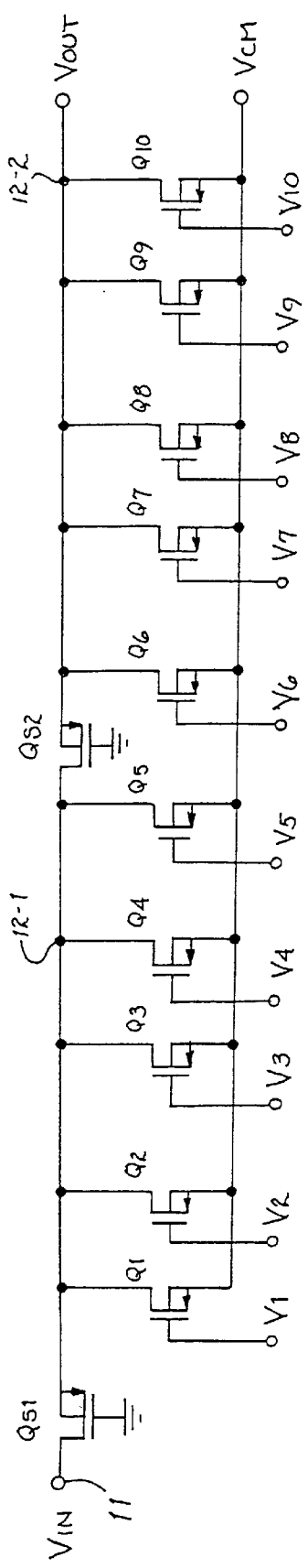
FIG. 7 is a schematic diagram of a logarithmic attenuator obtained by cascading logarithmic attenuators as shown in FIG. 3 to obtain increased linearity of the transfer characteristic.

The accuracy of the logarithmic attenuation transfer curve shown in the bottom graph of FIG. 2 depends on how many shunt transistors and corresponding control voltages V1,V2 . . . are utilized. If more shunt transistors are used, the cusps 27A are closer together and smaller in magnitude, so the transfer characteristic of the logarithmic attenuator is more accurate. However, as the sizes of the shunt transistors Q2, Q3, Q4 etc. in FIG. 3A progressively increase as described above, an excessive amount of chip area is required, and the gate capacitances of the shunt transistors greatly increase. The increased gate capacitance has the undesirable effect of reducing the bandwidth of the low noise logarithmic attenuator of FIG. 3A. To avoid this, two (or more) of the logarithmic attenuators of FIG. 2 can be cascaded together as shown in FIG. 7 by an additional series transistor $Q_{S2}$ connecting them in series. This increases the number of logarithmic attenuation stages without adding too much series resistance and without use of extremely "scaled up" shunt transistors that otherwise would be required. In this manner, the accuracy is increased without excessively increasing the noise-producing series resistance. The increased accuracy is indicated by a corresponding increase in the number of cusps 27A and a corresponding decrease in the amplitudes thereof.

Figure 8:
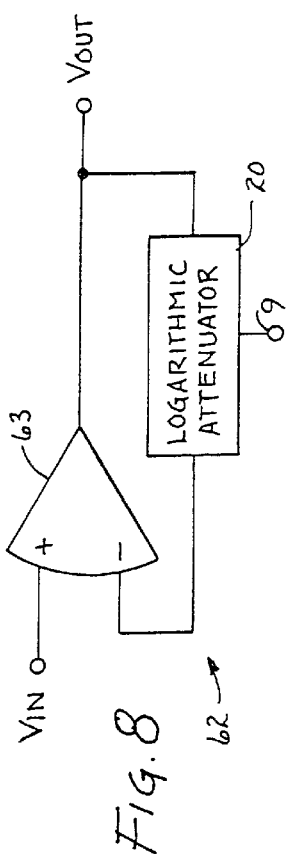
FIG. 8 is a block diagram of a logarithmic amplifier of the present invention using a logarithmic attenuator as a feedback element.

FIG. 8 shows an important practical application of the basic logarithmic attenuator 20, connected as a feedback element between the output and inverting input of an operational amplifier 63 to provide a logarithmic amplifier 62.

Figure 9:
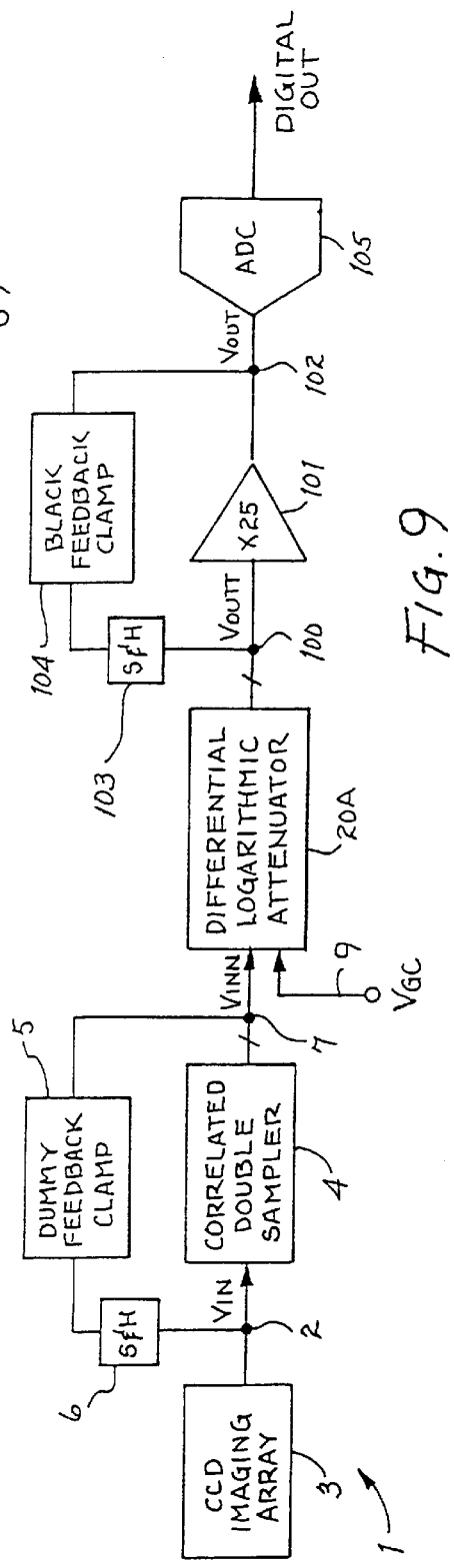
FIG. 9 is a block diagram of a system for digitizing data, including a logarithmic attenuator of the present invention.

Referring to FIG. 9, a CCD imaging system 1 digitizes the analog output signal $V_{IN}$ produced by a CCD imaging array 3. $V_{IN}$ is applied as a single-ended analog input to an input conductor 2 of a known correlated double sampler circuit 4, shown in the '618 patent. Correlated double sampler circuit 4 produces a differential output represented by the expression $V_{INN}=V_{INN}^+-V_{INN}^-$. A "dummy" feedback clamp circuit 5 shown in FIG. 9 is coupled between one of the conductors 11A and 11B and input conductor 2 by means of a sample and hold circuit 6 to compensate for any input offset voltage of correlated double sampler circuit 4.

Differential logarithmic attenuator 20A produces a differential output signal $V_{OUTT}=V_{OUTT}^+-V_{OUTT}^-$. $V_{OUTT}$ is applied to the inputs of a 25× differential-to-single-ended amplifier 101. Amplifier 101 produces its single-ended output voltage $V_{OUT}$ on conductor 102, which is connected to the input of a fast 10 bit analog-to-digital converter 105. Analog-to-digital converter 105 produces a 10 bit signal output DIGITAL OUT which accurately represents the input voltage $V_{IN}$ for each pixel of CCD imaging array 3.

It is important that the system 1 of FIG. 9 allow the gain or attenuation between the output of CCD imaging array 3 and the digital output of analog-to-digital converter 105 to be controlled in a logarithmic fashion, so that the attenuation or gain in decibels (dB) is linearly proportional to $V_{GC}$.

A "black feedback clamp" circuit 104 is coupled between conductor 102 and the differential input of amplifier 11 by a sample and hold circuit 103. It performs the function of clamping the output to a signal level that corresponds to a "black" image on a monitor.

The differential configuration of the resistive portion 20B of logarithmic attenuator 20A shown in FIG. 3B improves signal linearity. Such improved linearity results because the differential configuration tends to cancel second harmonic distortion. The differential configuration also provides good common mode noise rejection.

As explained above, the various logarithmic attenuators disclosed herein have substantially lower noise than those of the prior art. One reason that the low noise is desirable is because low noise logarithmic amplifiers are useful in some systems in which low noise amplifiers are required in the signal path, for example, as shown in subsequently described FIG. 11. Therefore, two low noise, low power, low distortion differential amplifier circuits suitable for such use are described next.

Figure 10A:
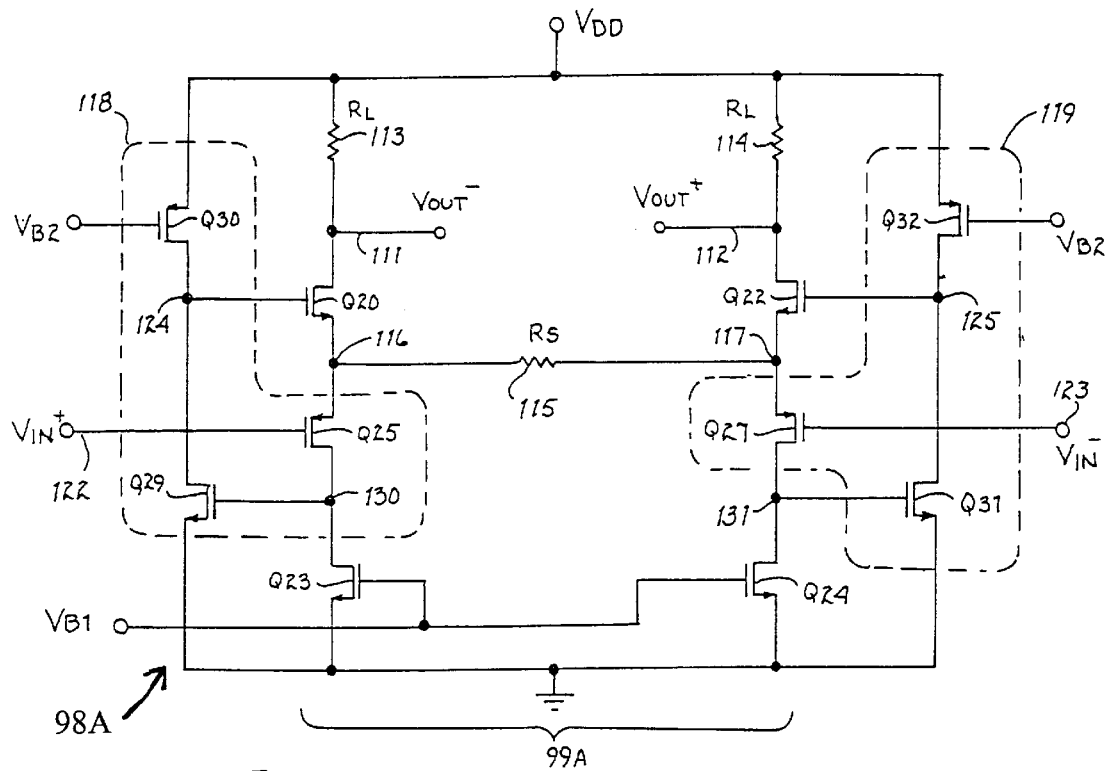
FIG. 10A is a schematic diagram of a low noise, low distortion, low power amplifier useful in block 98A of the embodiment of FIG. 11.

Referring next to FIG. 10A, low noise differential amplifier 98A includes unbalanced differential feedback amplifiers 118 and 119 and a differential stage 99A which includes load resistors 113 and 114, N-channel input MOSFETs Q20 and Q22, gain setting resistor 115, and N-channel current source MOSFETs Q23 and Q24. Load resistors 113 and 114 are connected by output conductors 111 and 112 to the drain of input MOSFETs Q20 and Q22, respectively. Resistor 115 of resistance $R_S$ is connected between the sources of MOSFETs Q20 and Q22. The gates of MOSFETs Q20 and Q22 are connected to the outputs 124 and 125 of unbalanced differential feedback amplifiers 118 and 119, respectively. Current source MOSFETs Q23 and Q24 in FIG. 10A have their drain electrodes coupled by P-channel MOSFETs Q25 and Q27 and conductors 116 and 117 to the sources of input MOSFETs Q20 and Q22, respectively.

MOSFET Q25 is an input transistor for a first stage of unbalanced differential feedback amplifier 118. The first stage of unbalanced differential feedback amplifier 118 uses current source MOSFET Q23 of differential stage 99A as a load device, and produces an output signal on conductor 130 to drive a second stage of unbalanced differential feedback amplifier 118 that includes N-channel MOSFET Q29 as an input transistor and P-channel MOSFET Q30 as a load device. The second stage of unbalanced differential feedback amplifier 118 produces the above mentioned output signal on conductor 124 to drive the gate of input MOSFET Q20 of differential stage 99A. Unbalanced differential feedback amplifier 118 is "referenced" to the voltage on conductor 116, which connects the source of N-channel input MOSFET Q20 of differential stage 99A to the source of the P-channel input MOSFET Q25 of feedback amplifier 118. The voltage on conductor 116 therefore acts as one input of unbalanced differential feedback amplifier 118, $V_{IN}^+$ being its other input.

Similarly, MOSFET Q27 is an input transistor for a first stage of unbalanced differential feedback amplifier 119. The first stage of unbalanced differential feedback amplifier 119 uses current source MOSFET Q24 of differential stage 99A as a load device, and produces an output signal on conductor 131 to drive a second stage of unbalanced differential feedback amplifier 119 that includes N-channel MOSFET Q31 as an input transistor and P-channel MOSFET Q32 as a load device. The second stage of unbalanced differential feedback amplifier 119 produces an output signal on conductor 125 to drive the gate of input MOSFET Q22 of differential stage 99A. Unbalanced differential feedback amplifier 119 is "referenced" to the voltage on conductor 117, which connects the source of N-channel input MOSFET Q22 of differential stage 99A to the source of P-channel input MOSFET Q27 of unbalanced differential feedback amplifier 119. The voltage on conductor 117 therefore is one input of unbalanced differential feedback amplifier 119, $V_{IN}^-$ being its other input. Note that there is no common mode input voltage associated with the "differential" inputs of either of unbalanced differential feedback amplifiers 118 or 119.

The circuit shown in FIG. 10A has an advantage over the circuits of the prior art in that the bias current through the load resistor 113 and input MOSFET Q20 of differential stage 99A also flows through the input transistor Q25 of feedback amplifier 118; this also is true with respect to the bias current that flows through load resistor 114, input MOSFET Q22 and the input MOSFET Q27 of feedback amplifier 119. The high bias currents flowing through input transistors Q20 and Q22 of differential stage 99A to increase its co are necessary to reduce thermal noise.

Figure 10B:
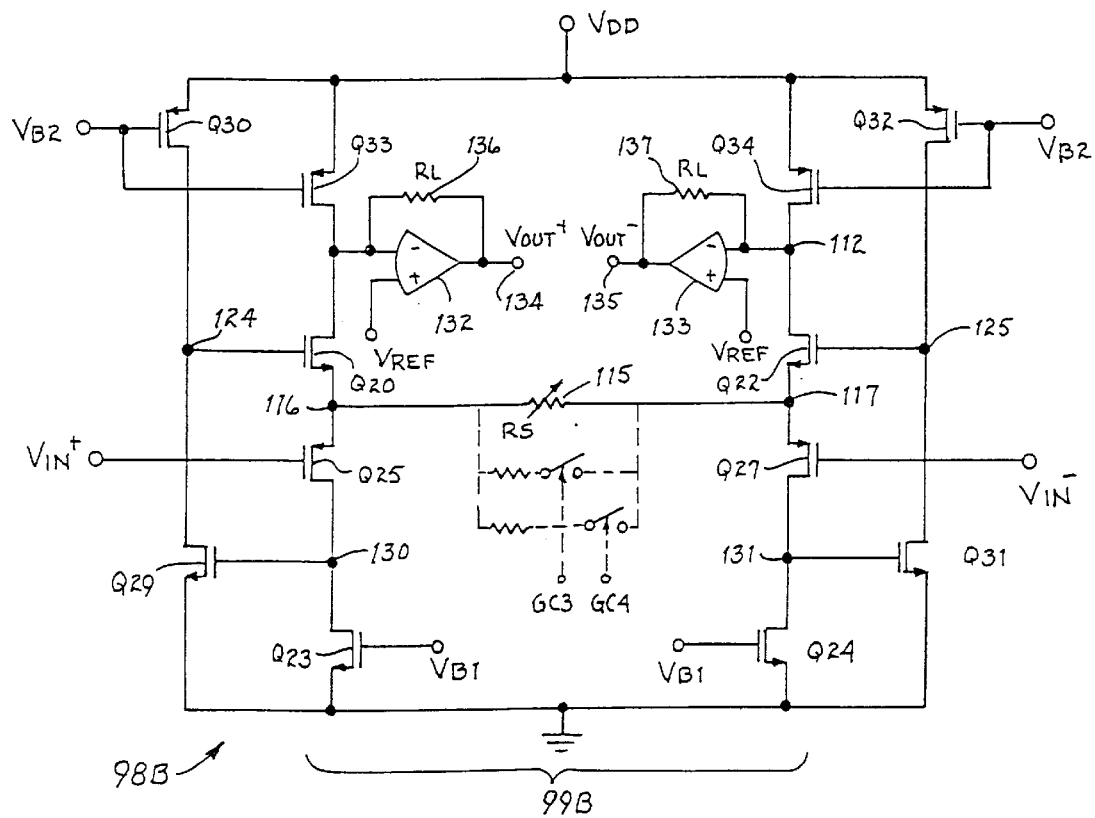
FIG. 10B is a schematic diagram of another low noise, low distortion, low power amplifier useful in the embodiment of FIG. 11.

FIG. 10B shows an alternative low noise differential amplifier 98B of the present invention. Differential amplifier 98B differs from differential amplifier 98A of FIG. 10A in that load resistor 113 in differential stage 99A of FIG. 10A is replaced by a P-channel MOSFET Q33 having its source connected to $V_{DD}$ and its drain connected to conductor 111. Similarly, load resistor 114 of FIG. 10A is replaced by P-channel MOSFET Q34 coupled between $V_{DD}$ and conductor 112. Conductor 111 is connected to the (−) input of an operational amplifier 132 having its (+) input connected to $V_{REF}$. A feedback resistor 136 of resistance $R_L$ is connected between the output of operational amplifier 132 on conductor 134 and the (−) input thereof. Operational amplifier 132 and load resistor 136 thus constitute a transconductance amplifier which operates as a current-to-voltage converter to produce $V_{OUT}^+$ on conductor 134. Similarly, conductor 112 is connected to the (−) input of operational amplifier 133, which has its (+) input connected to $V_{REF}$ and its output connected by conductor 135 to feedback resistor 137 of resistance $R_L$ to the (−) input of operational amplifier 133. The output voltage $V_{OUT}^-$ is produced on conductor 135. $V_{REF}$ can be selected to provide a suitable large common mode input voltage range. The resistance $R_S$ of resistor 115 is programmable, for example by switching additional resistors in parallel with resistor 115 as indicated by the dotted line resistors and switches, in response to gain control signals GC3 and GC4 of FIG. 6. Also, the feedback resistors 136 and 137 of transconductance amplifiers 132 and 133 could be programmable in the same manner.

In the circuit of FIG. 10B, the two transconductance amplifiers operate to maintain the voltages on conductors 111 and 112 at the voltage $V_{REF}$. This prevents input MOSFETs Q20 and Q22 of differential stage 99B from going into their non-linear operating regions, even for large values of the differential input voltage $V_{IN}^+ - V_{IN}^-$. Therefore, the differential amplifier of FIG. 10B may be advantageous over the one of FIG. 10A in cases in which the differential input signal range and/or the gain determined by the gain setting resistor 115 and the load resistors of resistance $R_L$ are large enough to cause the input MOSFETs Q20 and Q22 in FIG. 10A to go into their non-linear regions. The combined advantages of low noise operation and low distortion operation of FIG. 10A nevertheless are achieved.

Figure 11:
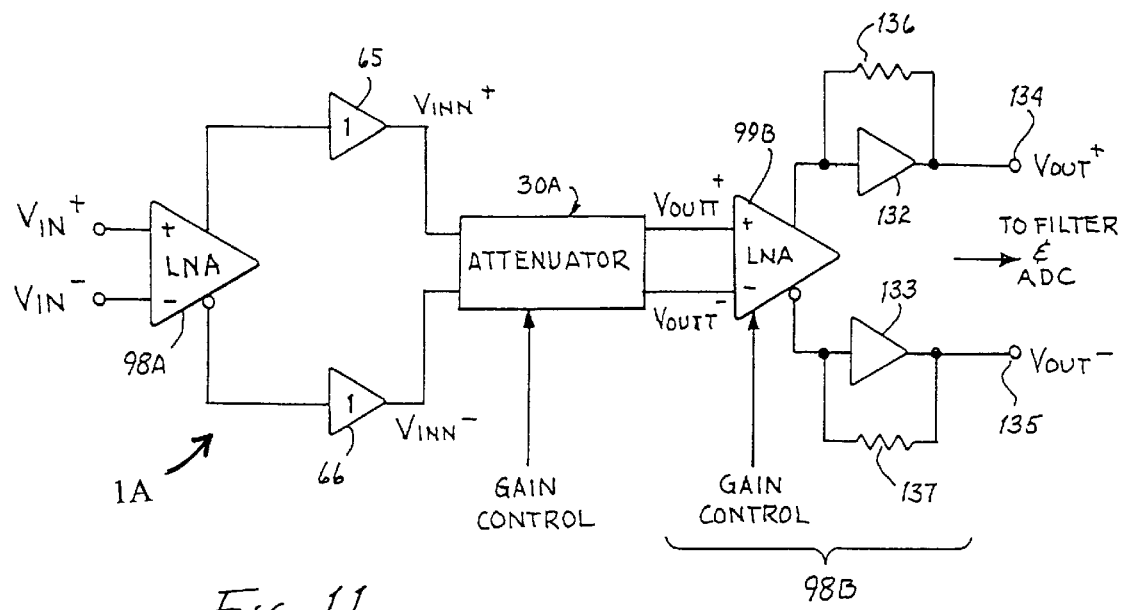
FIG. 11 is a block diagram of a programmable logarithmic amplifier of the present invention.

Referring next to FIG. 11, a programmable low noise logarithmic amplifier system 1A includes the above described low noise amplifier (LNA) 98A of FIG. 10A as an input stage. Its outputs 111 and 112 are buffered by unity gain amplifiers 66 and 65, respectively, to provide the signals $V_{INN}^+$ AND $V_{INN}^-$ as inputs to a programmable low noise logarithmic attenuator 30A. Programmable low noise logarithmic attenuator 30A is implemented using the differential low noise logarithmic attenuator 20B shown in FIG. 5, with each of the upper and lower sections being programmable as in the attenuator 30 of FIG. 5, and if desired, using the cascaded structure shown in FIG. 7 to increase the number of shunt resistive stages to improve linearity without requiring excessively large scaled-up MOSFETs. The outputs $V_{OUT1}^+$ AND $V_{OUT1}^-$ of programmable attenuator 30A are applied to the low noise, low distortion differential amplifier 98B of FIG. 10B to provide an accurate, low noise output signal between conductors 134 and 135 which can be applied to a subsequent filter and analog-to-digital converter as indicated.

The combination shown in FIG. 11 provides a low noise, highly programmable, low distortion logarithmically controlled gain system using low cost CMOS technology. This is in contrast to the prior art logarithmic attenuators in this field that have been implemented using bipolar transistor integrated circuit technology; such logarithmic attenuators have had higher distortion and have not had programmable attenuation or programmable gain. The embodiment shown in FIG. 11 also is in contrast to the MOSFET implementation shown in prior art FIG. 1 because the embodiment of FIG. 11 provides lower noise, and also provides selectable or programmable gain/attenuation.

While the invention has been described with reference to several particular embodiments thereof, those skilled in the art will be able to make the various modifications to the described embodiments of the invention without departing from the true spirit and scope of the invention. It is intended that all elements or steps which are insubstantially different or perform substantially the same function in substantially the same way to achieve the same result as what is claimed are within the scope of the invention.

What is claimed is:

1. A logarithmic attenuator circuit comprising:
   (a) a resistive attenuator including
      I. an input conductor and an output conductor,
      ii. a single series resistive element connected between the input conductor and the output conductor, and
      iii. a plurality of successive parallel controllable resistive elements each having a control terminal and each also having a first terminal connected to the output conductor; and
   (b) a control circuit producing a plurality of successive gradually increasing and then leveling off analog control signals on the control terminals, respectively, so as to change the controllable resistive elements from being at the edge of conduction to being fully on in response to gradual linear changing of an analog gain control signal from a first value to a second value, wherein fully on resistances of the successive parallel controllable resistive elements decrease progressively.

2. The logarithmic attenuator circuit of claim 1 wherein the resistances of the successive parallel resistive elements decrease exponentially.

3. The logarithmic attenuator circuit of claim 1 wherein the single series resistive element includes a MOSFET having its gate connected to a second reference voltage conductor.

4. The logarithmic attenuator of claim 3 wherein each parallel resistive element includes a MOSFET that also functions as the switching element coupling the parallel resistive element between the output conductor and the first reference voltage conductor.

5. The logarithmic attenuator of claim 1 wherein the control circuit includes a plurality of differential amplifiers each having a first input coupled to receive a corresponding gain control signal, respectively, on a corresponding gain control conductor and a second input, and a circuit producing a plurality of successive threshold voltages each having a larger magnitude than the previous one, the second inputs being coupled to receive the plurality of threshold voltages, respectively.

6. The logarithmic attenuator of claim 4 wherein the control circuit includes a plurality of differential amplifiers each having a first input coupled to receive a corresponding gain control signal on a corresponding gain control conductor and a second input, and a circuit producing a plurality of successive threshold voltages each having a larger magnitude than the previous one, the second inputs being coupled to receive the plurality of threshold voltages, respectively.

7. The logarithmic attenuator of claim 6 wherein each differential amplifier includes an output stage bias control circuit that maintains an output of that differential amplifier at a voltage approximately equal to a threshold voltage of a MOSFET functioning as a parallel resistive element and as a switching element if the magnitude of the gain control voltage is less than or equal to the magnitude of the threshold voltage applied to the second input of the differential amplifier.

8. The logarithmic amplifier of claim 4 wherein all of the MOSFETs are P-channel MOSFETs each having a source electrode connected to a body electrode.

9. A logarithmic attenuator circuit comprising;
(a) a first resistive attenuator including
  I. a first input conductor and a first output conductor,
  ii. a first single series resistive element connected between the first input conductor and the first output conductor, and
  iii a first group of successive parallel controllable resistive elements each having a control terminal and each also having a first terminal connected to the first output conductor;
(b) a second resistive attenuator including
  I. a second input conductor and a second output conductor,
  ii. a second single series resistive element connected between the second input conductor and the second output conductor, and
  iii. a second group of successive parallel controllable resistive elements each having a control terminal and each also having a first terminal connected to the second output conductor;
(c) a control circuit producing a plurality of successive gradually increasing and then leveling off analog control signals on the control terminals of successive controllable resistive elements of the first and second groups, respectively, so as to change the controllable resistive elements from being at the edge of condition to being fully on in response to gradual linear changing of an analog gain control signal from a first value to a second value, wherein fully on resistances of the successive parallel controllable resistive elements decrease progressively.

10. A logarithmic gain circuit comprising:
(a) an attenuator including
  I. an input conductor and an output conductor,
  ii. a single series impedance element connected between the input conductor and the output conductor, and
  iii. a plurality of successive parallel controllable impedance elements each having a control terminal and each also having a first terminal connected to the output conductor,
(b) an analog control circuit producing a plurality of successive control signals on the control terminals of successive controllable impedance elements, respectively, so as to change the controllable impedance elements from being at the edge of conduction to being fully on in response to linear changing of an analog gain control signal from a first value to a second value, a magnitude of each control signal gradually increasing and then leveling off at a predetermined value, wherein fully on impedance of the successive parallel controllable impedance elements decrease progressively.

11. A logarithmic gain circuit comprising:
(a) a resistive attenuator including
  I. an input conductor and an output conductor,
  ii a single series resistive element connected in series between the input conductor and the output conductor, and
  iii. a plurality of parallel successive resistive elements each having a first terminal connected to the output conductor, each of the parallel resistive elements including an electrically controllable resistive element having a control terminal operative to control the resistance thereof, each of the parallel resistive elements including a second terminal coupled to a common conductor; and
(b) an analog control circuit producing a plurality of successive piecewise-linear gradually changing analog control voltage signals on the control terminals of successive electrically controllable resistive elements, respectively, so as to change the electrically controllable resistive elements form being at the edge of conduction to being fully on in response to gradual changing of an analog gain control signal from a first value to a second value, wherein fully on resistances of the electrically controllable resistive elements of the successive parallel resistive elements decrease progressively.

12. A logarithmic amplifier circuit comprising:
(a) an operational amplifier having an inverting input, a non-inverting input, and an output;
(b) a logarithmic attenuator having an input coupled to the output of the operational amplifier and an output coupled to the inverting input of the operational amplifier, the logarithmic attenuator including
  (1) a resistive attenuator including
    I. an input conductor and an output conductor,
    ii. a single series resistive element connected between the input conductor and the output conductor, and
    iii. a plurality of successive parallel resistive elements each having a first terminal connected to the output conductor, each of the successive parallel resistive elements including an electrically controllable resistive element having a control terminal operative to control the resistance thereof, each of the parallel resistive elements including a second terminal coupled to a common conductor; and
  (2) an analog control circuit producing a plurality of successive piecewise-linear gradually changing analog control voltage signals on the control terminals of successive electrically controllable resistive elements, respectively, so as to change the electrically controllable resistive element from being at the edge of conduction to being fully on in response to gradual changing of an analog gain control signal from a first value to a second value, wherein fully on resistances of the electrically controllable resistive elements of the successive parallel resistive elements decrease progressively.

13. A logarithmic amplifier circuit comprising:
(a) first and second amplifiers each having an input and an output;

(b) a logarithmic attenuator having an input coupled to the output of the first amplifier and an output coupled to the input of the second amplifier, the logarithmic attenuator including
- (1) a resistive attenuator including
  - I. an input conductor and an output conductor,
  - ii. a single series resistive element connected between the input conductor and the output conductor, and
  - iii. a plurality of successive parallel resistive elements each having a first terminal connected to the output conductor, each of the parallel resistive elements including an electrically controllable resistive element having a control terminal operative to control the resistance thereof, each of the parallel resistive elements including a second terminal coupled to a common conductor; and
- (2) an analog control circuit producing a plurality of successive piecewise-linear gradually changing analog control voltage signals on the control terminals of successive electrically controllable resistive elements, respectively, so as to change the electrically controllable resistive elements from being at the edge of conduction to being fully on in response to gradual changing of an analog gain control signal from a first value to a second value, wherein fully on resistance of the electrically controllable resistive elements of the successive parallel resistive elements.

14. A method of operating a circuit to provide a logarithmically controlled gain, comprising:
(a) providing a resistive attenuator including an input conductor and an output conductor, a single series resistive element connected between the input conductor and the output conductor, and a plurality of successive parallel resistive elements each having a first terminal connected to the output conductor, each of the successive parallel resistive elements including an electrically controllable resistive element having a control terminal operative to control the resistance thereof, each of the parallel resistive elements including a second terminal coupled to a common conductor; and
(b) producing a plurality of gradually changing successive piecewise-linear analog control voltage signals on the control terminals of successive electrically controllable resistive elements, respectively, so as to change the electrically controllable resistive elements from being at the edge of conduction to being fully on, wherein fully on resistive of the electrically controllable resistive elements of the successive parallel resistive elements decrease progressively.

15. The method of claim 14 wherein step (b) includes producing the plurality of successive piece-wise linear analog control voltage signals in response to gradual linear changing of an analog gain control signal from a first value to a second value.

16. A programmable logarithmic attenuator circuit comprising:
(a) a resistive attenuator including
  I. an input conductor and an output conductor,
  ii. a single series resistive element connected between the input conductor and the output conductor,
  iii. a first group of parallel electrically controllable resistive elements each having a control terminal and each also having a first terminal connected to the output conductor, and
  iv. a second group of parallel electrically controllable resistive elements each having a first terminal connected to the output conductor;

(b) a first gain control conductor coupled to the control terminal of each of the electrically controllable resistive elements of the first group, and a second gain control conductor coupled to the control terminal of each of the electrically controllable resistive elements of the second group, to control a gain of the programmable logarithmic attenuator circuit by turning on any selected combination of the electrically controllable resistive element of the first group, or the electrically controllable resistive elements of the second group; and
(c) a control circuit producing a plurality of successive gradually increasing and then leveling off analog control signals on the control terminals of successive ones of the electrically controllable resistive elements, respectively, so as to change the electrically controllable resistive elements from being at the edge of conduction to being fully on in response to gradual linear changing of an analog gain control signal from a first value to a second value, wherein fully on resistances of the successive electrically controllable resistive elements decrease progressively.

17. A differential logarithmic attenuator circuit comprising:
(a) a first resistive attenuator including
  I. a first input conductor and a first output conductor,
  ii. a single series resistive element connected between the first input conductor and the first output conductor, and
  iii. a first group of parallel electrically controllable resistive elements each having a control terminal and each also having a first terminal connected to the output conductor;
(b) a second resistive attenuator including
  I. a second input conductor and a second output conductor,
  ii. a single series resistive element connected between the second input conductor and the second output conductor, and
  iii. a second group of parallel electrically controllable resistive elements each having a control terminal aid each also having a first terminal connected to the second output conductor;
(c) a control circuit producing a plurality of successive gradually increasing and then leveling off analog control signals on the control terminals of successive ones of the electrically controllable resistive elements, respectively, so as to change the electrically controllable resistive elements from being at the edge of conduction to being fully on in response to gradual linear chancing of an analog gain control signal from a first value to a second value, wherein fully on resistance of the successive electrically controllable resistive elements decrease progressively.

18. The differential logarithmic attenuator circuit of claim 17 including a low noise differential amplifier having first and second inputs coupled to the first and second output conductors, respectively, the low noise differential amplifier including
(1) a differential stage including
  i. first and second load devices coupled between a first reference voltage and first and second conductors, respectively,
  ii. a resistor,
  iii. a first input transistor having a first electrode coupled to the first conductor, and a second electrode coupled by a third conductor to a first terminal of the resistor, and a second input transistor having a first electrode coupled to the second conductor, and a second electrode coupled by a fourth conductor to a second terminal of the resistor, iv. a first current source coupled to provide a first bias current, and a second current source coupled to provide a second bias current;

(2) a first feedback amplifier including a third input transistor coupled between the third conductor and the first current source and having a gate electrode coupled to the first output conductor, the first feedback amplifier producing a first signal on the control electrode of the first input transistor of the differential stage, the first bias current flowing through the first load device, the first input transistor, the third input transistor, and the first current source; and (3) a second feedback amplifier including a fourth input transistor coupled between the fourth conductor and the second current source and having a gate electrode coupled to the second output conductor, the second feedback amplifier producing a second signal on the control electrode of the second input transistor, the second bias current flowing through the second load device, the second input transistor, the fourth input transistor, and the second current source.

19. The differential logarithmic attenuator circuit of claim 17 including a low noise differential amplifier having first and second outputs coupled to the first input conductor and the second input conductor, respectively, the low noise differential amplifier including (1) a differential stage including i. first and second load devices coupled between a first reference voltage and first and second conductors, the first conductor being coupled to the first input conductor, and the second conductor being coupled to the second input conductor, respectively, ii. a resistor, iii. a first input transistor having a first electrode coupled to the first conductor and a second electrode coupled by a third conductor to a first terminal of the resistor, and a second input transistor having a first electrode coupled to the second conductor and a second electrode coupled by a fourth conductor to a second terminal of the resistor, iv. a first current source coupled to provide a first bias current, and a second current source coupled to provide a second bias current;

(2) a first feedback amplifier including a third input transistor coupled between the third conductor and the first current source and having a gate electrode coupled to receive a first input signal, the first feedback amplifier producing a first signal on the control electrode of the first input transistor of the differential stage, the first bias current flowing through the first load device, the first input transistor, the third input transistor, and the first current source; and (3) a second feedback amplifier including a fourth input transistor coupled between the fourth conductor and the second current source and having a gate electrode coupled to receive a second input signal, the second feedback amplifier producing a second signal on the control electrode of the second input transistor, the second bias current flowing through the second load device, the second input transistor, the fourth input transistor, and the second current source.

20. The differential logarithmic attenuator circuit of claim 17 including first and second low noise differential amplifiers, the first low noise differential amplifier including (1) a first differential stage including i. first and second load devices coupled between a first reference voltage and first and second conductors, respectively, ii. a first resistor, iii. a first input transistor having a first electrode coupled to the first conductor, and a second electrode coupled by a third conductor to a first terminal of the first resistor, and a second input transistor having a first electrode coupled to the second conductor, and a second electrode coupled by a fourth conductor to a second terminal of the first resistor, iv. a first current source coupled to provide a first bias current, and a second current source coupled to provide a second bias current;

(2) a first feedback amplifier including a third input transistor coupled between the third conductor and the first current source and having a gate electrode coupled to the first output conductor, the first feedback amplifier producing a first signal on the control electrode of the first input transistor of the differential stage, the first bias current flowing through the first load device, the first input transistor, the third input transistor, and the first current source; and (3) a second feedback amplifier including a fourth input transistor coupled between the fourth conductor and the second current source and having a gate electrode coupled to the second output conductor, the second feedback amplifier producing a second signal on the control electrode of the second input transistor, the second bias current flowing through the second load device, the second input transistor, the fourth input transistor, and the second current source, the second low noise differential amplifier including (1) a second differential stage including i. third and fourth load devices coupled between the first reference voltage and fifth and sixth conductors, the fifth conductor being coupled to the first input conductor, and the sixth conductor being coupled to the second input conductor, respectively, ii. a second resistor, iii. a fifth input transistor having a first electrode coupled to the fifth conductor and a second electrode coupled by a seventh conductor to a first terminal of the second resistor, and a sixth input transistor having a first electrode coupled to the sixth conductor and a second electrode coupled by an eighth conductor to a second terminal of the second resistor, iv. a third current source coupled to provide a third bias current, and a fourth current source coupled to provide a fourth bias current;

(2) a third feedback amplifier including a seventh input transistor coupled between the seventh conductor and the third current source and having a gate electrode coupled to receive a first input signal, the third feedback amplifier producing a third signal on the control electrode of the fifth input transistor of the second differential stage, the first bias current flowing through the third load device, the fifth input transistor, the seventh input transistor, and the third current source; and (3) a fourth feedback amplifier including an eighth input transistor coupled between the eighth conductor and the fourth current source and having a gate electrode coupled to receive a second input signal, the fourth feedback amplifier producing a fourth signal on the control electrode of the sixth input transistor, the second bias current flowing through the fourth load device, the sixth input transistor, the eighth input transistor, and the fourth current source.

21. A method of operating a circuit to provide programmable logarithmically controlled attenuation, comprising:

(a) providing a resistive attenuator including an input conductor and an output conductor, a single series resistive element connected between the input conductor and the output conductor, a first group of parallel electrically controllable resistive elements each having a first terminal connected to the output conductor, each having a control terminal, and a second group of parallel her electrically controllable resistive elements each having a first terminal connected to the output conductor, each having a control terminal;

(b) applying a first gain control signal to the control terminal of each of the electrically controllable resistive elements of the first group, and a second gain control signal to the control terminal of each of the electrically controllable resistive elements of the second group to select the attenuation by turning on to a predetermine degree any selected combination of the electrically controllable resistive elements of the first group, the electrically controllable resistive elements of the second group; and (c) producing a plurality of successive gradually increasing and then leveling off analog control signals on the control terminals of successive ones of the electrically controllable resistive elements, respectively, so as to change the controllable resistive elements from being at the edge of conduction to being fully on in response to gradual linear changing of an analog gain control signal from a first value to a second value.

* * * * *